United States Patent
Tsorng et al.

(10) Patent No.: US 12,396,121 B2
(45) Date of Patent: Aug. 19, 2025

(54) RETRACTABLE MODULE

(71) Applicant: Quanta Computer Inc., Taoyuan (TW)

(72) Inventors: Yaw-Tzorng Tsorng, Taoyuan (TW);
Ming-Lung Wang, Taoyuan (TW);
Kai-Hsiang Chang, Taoyuan (TW);
Jia-Lin Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 296 days.

(21) Appl. No.: 18/299,264

(22) Filed: Apr. 12, 2023

(65) Prior Publication Data
US 2024/0349444 A1 Oct. 17, 2024

(51) Int. Cl.
*G09F 3/02* (2006.01)
*H05K 7/14* (2006.01)

(52) U.S. Cl.
CPC ............. *H05K 7/1498* (2013.01); *G09F 3/02* (2013.01)

(58) Field of Classification Search
CPC ........ A47B 97/02; B60R 7/081; B60J 3/0208; G09F 15/0025; G09F 11/29; G09F 11/18; E06B 9/40; E06B 9/60; E06B 2009/905; H05K 7/1498; H05K 5/0252
USPC .................................................. 40/514–517
See application file for complete search history.

(56) References Cited

U.S. PATENT DOCUMENTS

| | | | | |
|---|---|---|---|---|
| 4,982,685 A | * | 1/1991 | Abe | B42D 3/14 116/237 |
| 5,115,757 A | * | 5/1992 | Abe | B42D 3/14 116/237 |
| 5,359,797 A | * | 11/1994 | Williamson | G09F 11/29 40/904 |
| 5,806,202 A | * | 9/1998 | Blackman | G01B 3/1005 242/381.3 |
| 7,331,134 B2 | * | 2/2008 | Oross | E05B 73/0082 361/679.55 |
| 9,280,920 B2 | * | 3/2016 | Meng | G09F 3/0335 |
| 2006/0221589 A1 | * | 10/2006 | Campini | H05K 7/1429 361/796 |
| 2006/0283956 A1 | * | 12/2006 | Conzola | G09F 3/02 235/487 |

FOREIGN PATENT DOCUMENTS

FR 2356177 A1 * 1/1978

* cited by examiner

*Primary Examiner* — Cassandra Davis
(74) *Attorney, Agent, or Firm* — NIXON PEABODY LLP

(57) ABSTRACT

A retractable module includes a pair of bases spaced apart and a tube positioned between the bases. The tube is configured to rotate about its center axis relative to the bases. The retractable module includes a latch including one or more prongs. The latch is configured to move between a release position and a fixed position. The retractable module includes a first spring configured to urge the tube to rotate in a first direction. The first spring includes a first end and a second end. The first end being fixed to one base of the bases, and the second end being fixed to the tube. The retractable module further includes a sheet wrapped around the tube. The sheet is configured to unwrap from around the tube as the tube rotates in the second direction and wrap around the tube as the tube rotates in the first direction.

24 Claims, 14 Drawing Sheets

RETRACTABLE MODULE

FIELD OF THE INVENTION

The present invention relates generally to a retractable module, and more specifically, to a module in an electronic device with a retractable label.

BACKGROUND OF THE INVENTION

Electronic devices, such as computing devices, typically have label modules that contain information that describes aspects of the electronic device. For example, in the field of computing devices, such as server computing devices, there may be a rack with many different server computing devices, within a room full of similar racks. Label modules physically located on the server computing devices are used to describe aspects of the server computing devices, such as identifying the devices.

Referring to FIG. 1, a chassis 102 is shown of a computing device 100. The chassis 102 includes a label module 104 that can contain a label that includes information that describes aspects of the computing device 100. The chassis 102 can further include thermal holes 106. As shown, the label module 104 is affixed to the chassis 102 in a way that can restrict airflow through the thermal holes 106, which can affect performance of the computing device 100.

Referring to FIG. 2, another chassis 202 is shown of another computing device 200. The chassis 202 includes a label module 204 that, again, can contain a label that includes information that describes aspects of the computing device 200. Unlike the label module 104 of FIG. 1, the label module 204 lies flat on the chassis 202. However, lying flat takes up more horizontal space on the chassis 202, which could otherwise be used to attach another device to the chassis 202.

Accordingly, needs exist for a retractable module, and a computing device with such a retractable module, that does not suffer from these and similar issues.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an implementation of a retractable module is disclosed. The retractable module includes a pair of bases spaced apart. The retractable module further includes a tube positioned between the pair of bases. The tube is configured to rotate about its center axis relative to the pair of bases. The retractable module further includes a latch including one or more prongs. The latch is configured to move between a release position and a fixed position. The retractable module further includes a first spring configured to urge the tube to rotate in a first direction. The first spring includes a first end and a second end. The first end is fixed to not rotate with the tube. The second end is fixed to the tube. The second end is configured to rest against at least one prong of the one or more prongs when the tube rotates in the first direction with the latch in the fixed position. The second end is further configured to freely rotate with the tube in the first direction with the latch in the release position. The second end is further configured to freely rotate with the tube in a second direction, opposite the first direction, with the latch in the release position. The retractable module further includes a sheet wrapped around the tube. The sheet is configured to unwrap from around the tube as the tube rotates in the second direction and wrap around the tube as the tube rotates in the first direction.

According to certain further aspects, the second end of the first spring is further configured to override the one or more prongs as the tube rotates in the second direction with the latch in the fixed position. According to certain further aspects, the latch includes a rod that extends between the pair of bases along the center axis of the tube, with a first end of the latch, opposite the one or more prongs, extending from a first base of the pair of bases. According to certain further aspects, the one or more prongs extend out from one base of the pair of bases, and an end of the latch extends from the one base. According to certain further aspects, the one or more prongs include four prongs evenly spaced around the tube. According to certain further aspects, the retractable module further includes an end stop attached to a first end of the sheet. The end stop prevents the tube from rotating beyond a stop position. According to certain further aspects, the retractable module further includes a second spring being configured to urge the latch to the fixed position. According to certain further aspects, the sheet is a metal sheet or a plastic sheet. According to certain further aspects, the sheet is curved along its width so as to support its own weight when extended from the tube.

According to certain aspects of the present disclosure, an implementation of a computer system is disclosed. The computer system includes a chassis. The computer system further includes a retractable module on the chassis. The retractable module includes a tube configured to rotate about its center axis. The retractable module further includes a sheet wrapped around the tube. The sheet is configured to wrap around the tube as the tube rotates in the first direction and unwrap from around the tube as the tube rotates in a second direction.

According to certain further aspects, the retractable module further includes a latch including one or more prongs. The latch is configured to move between a release position and a fixed position. According to certain further aspects, the retractable module further includes a first spring configured to urge the tube to rotate in a first direction. The first spring includes a first end and a second end. The first end is fixed to the tube. The second end is configured to override the one or more prongs as the tube rotates in a second direction, with the latch in the fixed position. The second end is further configured to rest against at least one prong of the one or more prongs when the tube rotates in the first direction, opposite the second direction, with the latch in the fixed position. The second end is further configured to freely rotate with the tube in the first direction with the latch in the release position. The second end is further configured to freely rotate with the tube in a second direction, opposite the first direction, with the latch in the release position. According to certain further aspects, the retractable module further includes a second spring configured to urge the latch to the fixed position. According to certain further aspects, the retractable module further includes a pair of bases on opposite sides of the tube. The tube is configured to rotate about its center axis between the pair of bases. The latch includes a rod that extends between the pair of bases along the center axis of the tube, with a first end of the latch, opposite the one or more prongs, extending from a first base of the pair of bases. According to certain further aspects, the one or more prongs extend out from one base of the pair of bases, and an end of the latch extends from the one base. According to certain further aspects, the one or more prongs include four prongs evenly spaced around the tube. According to certain further aspects, the retractable module further includes an end stop attached to a first end of the sheet, the end stop preventing the tube from rotating beyond a stop position. According to certain further aspects, the sheet is a metal sheet or a plastic sheet. According to certain further aspects, the retractable module further includes the sheet is curved along its width so as to support its own weight when extended from the tube.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
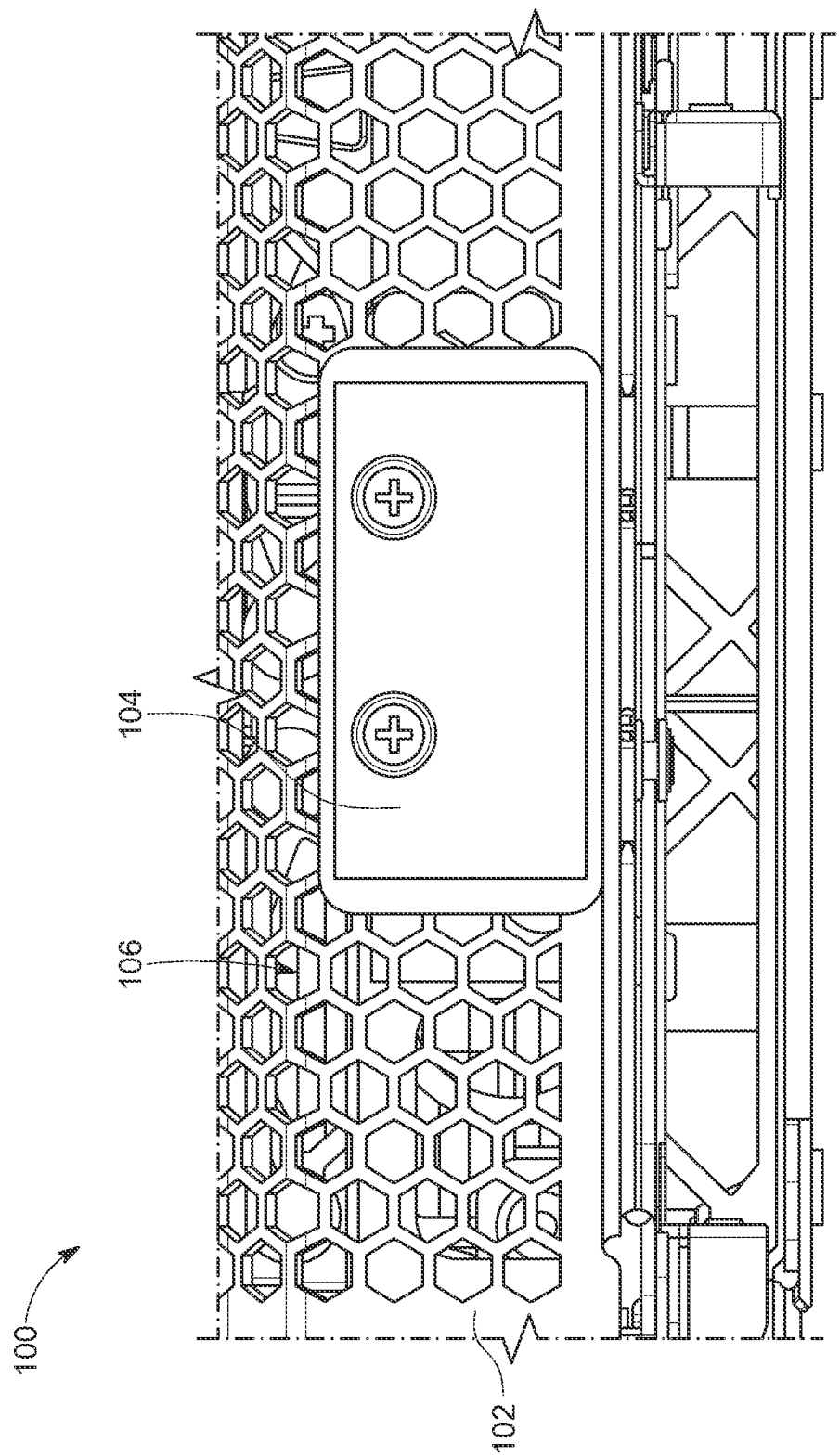
FIG. 1 is a partial side view showing a conventional label module.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure is directed to a retractable module that includes a retractable sheet that can provide information for an associated electronic device. The retractable sheet in the extended state provides the details. The retractable sheet can then retract back into the retractable module.

Figure 3:
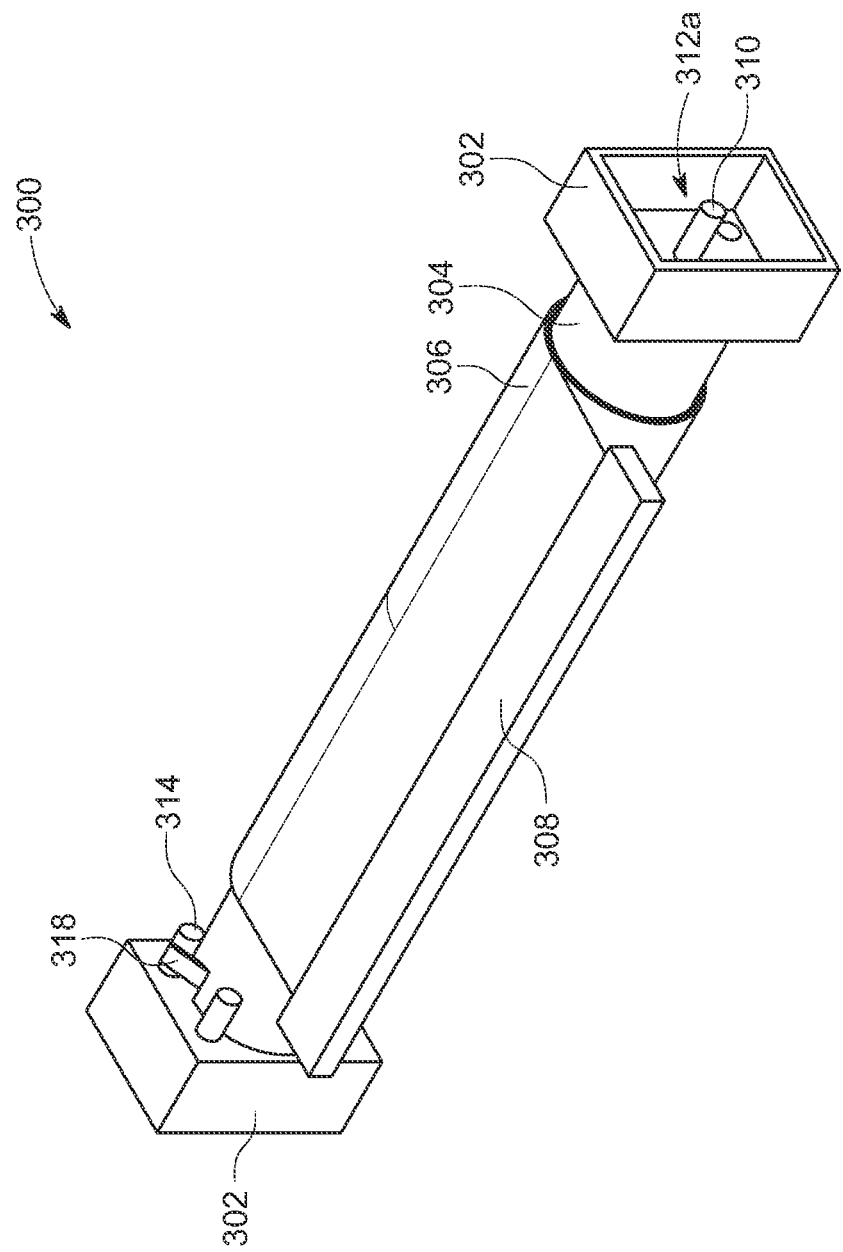
FIG. 3 is a perspective view of retractable module, according to certain aspects of the present disclosure.
Figure 4:
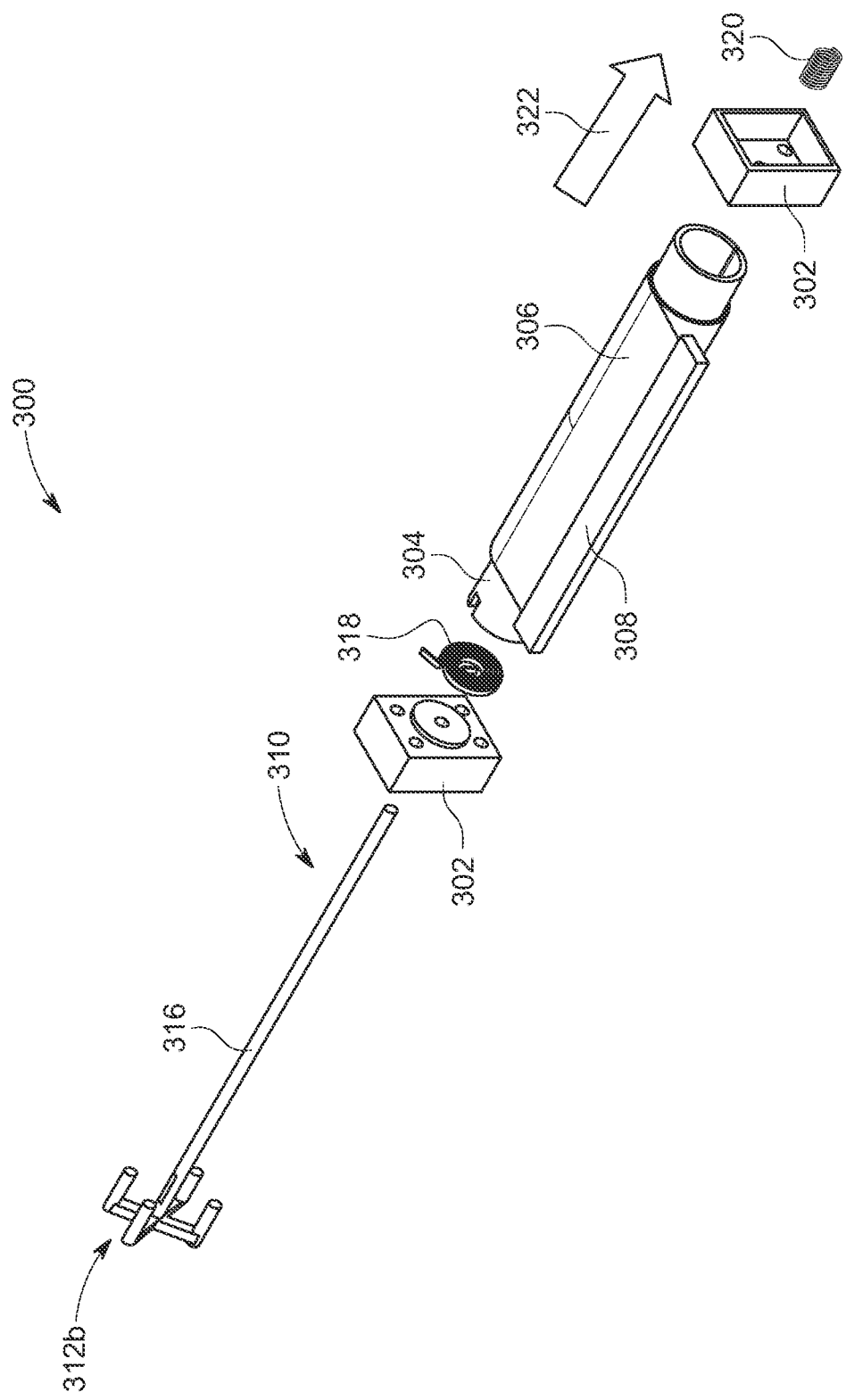
FIG. 4 is an exploded view of the retractable module of FIG. 3, according to certain aspects of the present disclosure.

FIG. 3 is a perspective view of retractable module 300, according to certain aspects of the present disclosure. Further, FIG. 4 is an exploded view of the module 300 of FIG. 3, according to certain aspects of the present disclosure. The module 300 includes a pair of bases 302 spaced apart. Each base 302 serves as a foundation for the module 300 with respect to the other components of the module 300 describes below. According to some aspects, each base 302 is further used to fix the module 300 to a chassis of a computer, as described below with respect to, for example, FIG. 11. According to simple implementations, the pair of bases 302 can be within a housing (e.g., housing 1100) that is connected to a chassis of a computing device. Alternatively, the pair of bases 302 can attach the module 300 to a chassis of a computing device without a housing. Further, according to some aspects, the pair or bases 302 can be considered opposing walls of a housing, rather than blocks as shown in FIG. 3.

The module 300 further includes a tube 304. The tube 304 is positioned between the pair of bases 302. The tube 304 is configured to rotate about its center axis relative to the pair of bases 302. The tube 304 can be various sizes depending on the amount of information that is intended to be carried on the associated label discussed below.

A sheet 306 is wrapped around the tube 304. The sheet 306 can include the above-described label that contains information that describes aspects of the corresponding chassis and computing device that the module 300 is attached to, as described further below with respect to, for example, FIG. 12. According to some aspects, the sheet 306 can include an end stop 308. The end stop 308 prevents the sheet 306 from being retracted too far around the tube 304.

A latch 310 extends between the pair of bases 302. The latch 310 is configured to move between a released position and a fixed position, as further described below. The latch 310 can extend along a center axis of the tube 304. A first end 312a of the latch 310 can extend out from one base 302 opposite the tube 304. A second end (312b in FIG. 4) of the latch 310 can reside in the opposing base 302. However, other arrangements and configurations of the latch 310 are contemplated. For example, the ends 312a and 312b of the latch 310 can reside/extend from the same base 302, rather than the latch 310 spanning between the pair of bases 302.

The latch 310 includes one or more prongs 314 that extend from the latch 310 at the end 312b. The prongs 314 extend out from the base 302 toward the tube 304, as shown in FIG. 3. Although four prongs are shown in FIG. 4, there can be any number of prongs, such as one, two, three, five, six, etc. The prongs 314 can be evenly arranged around the circumference of the tube 304. Alternatively, the prongs 314 can be unevenly arranged around the circumference of the tube 304. As described further below (FIGS. 5A-6B), the prongs 314 operate to provide the released position and the fixed position.

The latch 310 further includes a rod 316. The rod 316 can extend the length of the tube 304. Alternatively, where the latch 310 does not extend between the pair of bases 302, the latch 310 may not include the rod 316, or the rod 316 may be shortened.

A spring 318 is included in the tube 304. As described further below (FIGS. 6A and 6B), the spring 318 is configured to urge the tube 304 to rotate. The prongs 314 are configured to prevent the spring 318 and, therefore, the tube 304 from rotating. Thus, the state of the prongs 314 relative to the spring 318 defines the released state and the fixed state.

According to some implementations, the module 300 includes a spring 320. The spring 320 is configured to urge the latch 310 into the fixed position. Thus, in the arrangement show in FIG. 4, the spring 320 is configured to urge the latch 310 in the direction of arrow 322. This maintains the prongs 314 extending out from the opposite base 302.

Figure 5A:
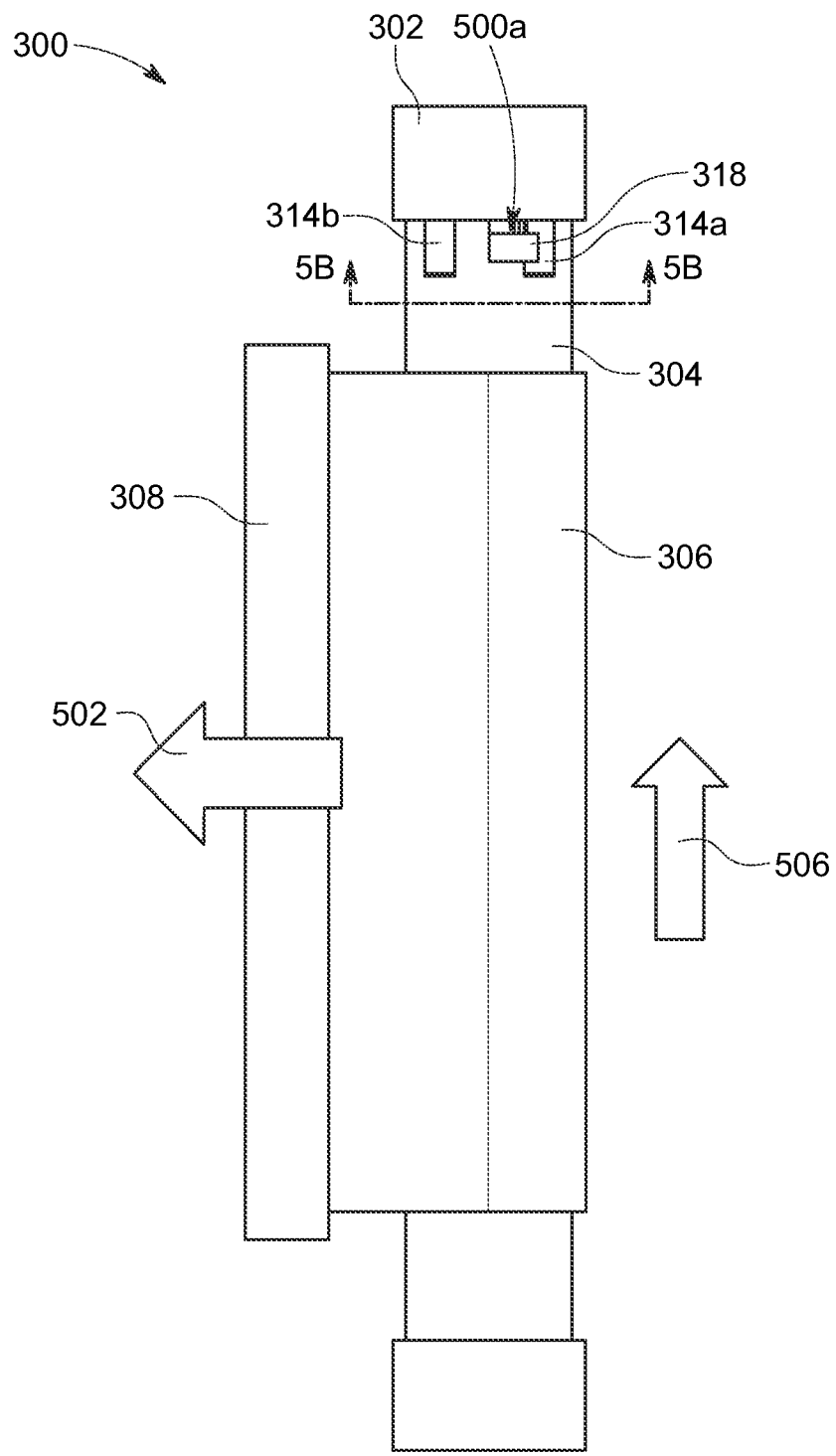
FIG. 5A is a plan view of the retractable module of FIG. 3, according to certain aspects of the present disclosure.
Figure 5B:
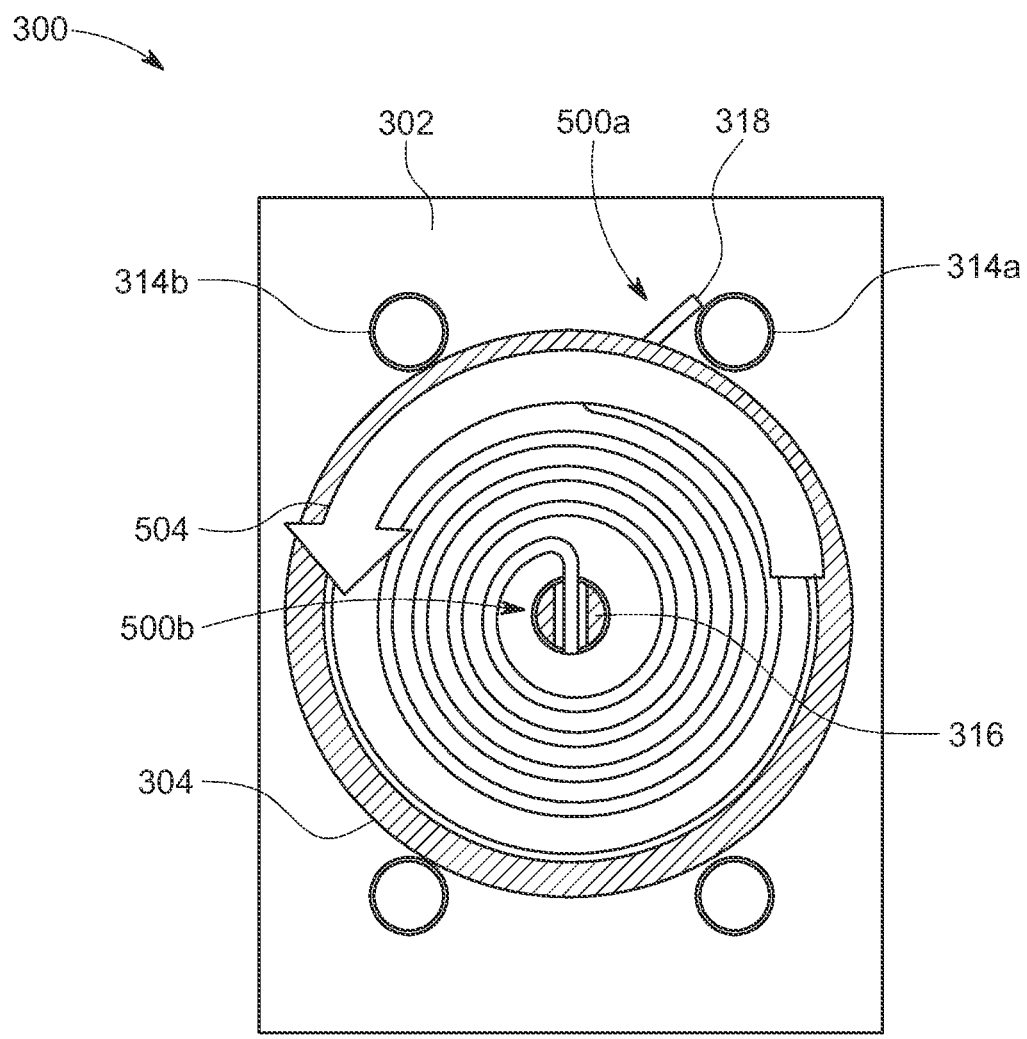
FIG. 5B is a cross-section view of the retractable module in FIG. 5A along the line 5B-5B, according to certain aspects of the present disclosure.

Referring to FIGS. 5A and 5B, FIG. 5A shows a plan view of the retractable module 300 of FIG. 3, and FIG. 5B shows a cross-section view of the retractable module 300 along the line 5B-5B in FIG. 5A, according to certain aspects of the present disclosure. As shown in FIG. 5B, the spring 318 includes an end 500a that generally is fixed to the tube 304 such that the tube 304 rotating also causes the end 500a of the spring 318 to rotate. The spring 318 further includes an end 500b. The end 500b is generally fixed so that it does not rotate as the tube 304 rotates. According to some aspects, the end 500b can be fixed to the rod 316. Alternatively, the end 500b can be fixed to the base 302.

Pulling on the end stop 308 or the sheet 306 in the direction of arrow 502 in FIG. 5A causes the tube 304 to rotate in the direction of arrow 504 in FIG. 5B. As the tube 304 rotates in the direction of arrow 504, the end 500a of the spring 318 rotates with the tube 304. However, the end 500b of the spring 318 does not rotate with the tube 304. Accordingly, tension builds in the spring 318 the farther the sheet 306 is withdrawn in the direction of arrow 502 in FIG. 5A.

The latch 310 is configured to move between a fixed position and a released position. The fixed position is shown in FIG. 5A based on the prongs 314a and 314b extending from the base 302. The released position occurs when the latch 310 is moved to cause the prongs 314a and 314b to retract into the base 302. The latch 310 moves from the fixed position to the released position by moving in the direction of the arrow 506 in FIG. 5A. For example, a user can move the latch 310 in the direction of arrow 506.

With the latch 310 in the released position, the prongs 314a and 314b are retracted into the base 302. This allows the end 500b of the spring 318 to freely rotate with the tube 304 in the direction of the arrow 504. However, according to some implementations, the end 500a of the spring 318 can be configured to instead, or additionally, override the prongs 314a and 314b with the latch 310 in the fixed position. For example, as the tube 304 rotates in the direction of the arrow 504, the end 500a of the spring 318 may deflect beneath the prong 314b despite the latch 310 (and the prong 314b) being in the fixed position. In either case, the tube 304 and the end 500a of the spring 318 can rotate several times to allow for the sheet 306 to fully extend from being wrapped around the tube 304.

The latch 310 moves from the released position back to the fixed position by moving in the opposite direction of the arrow 506. For example, the spring 320 (FIG. 4) can cause the latch 310 to move back to the fixed position once the user lets go of the latch 310.

Figure 6A:
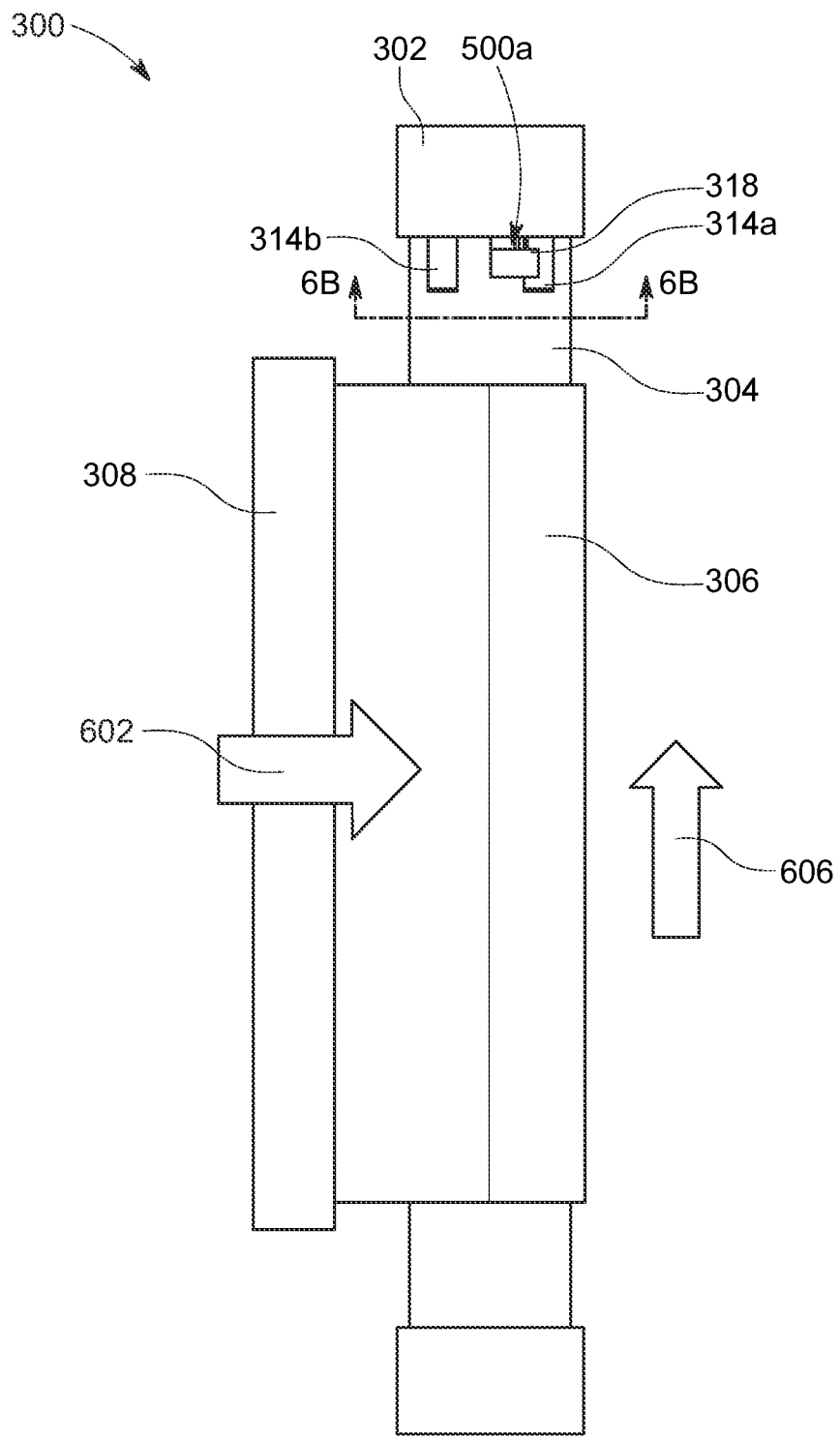
FIG. 6A is another plan view of the retractable module of FIG. 3, according to certain aspects of the present disclosure.
Figure 6B:
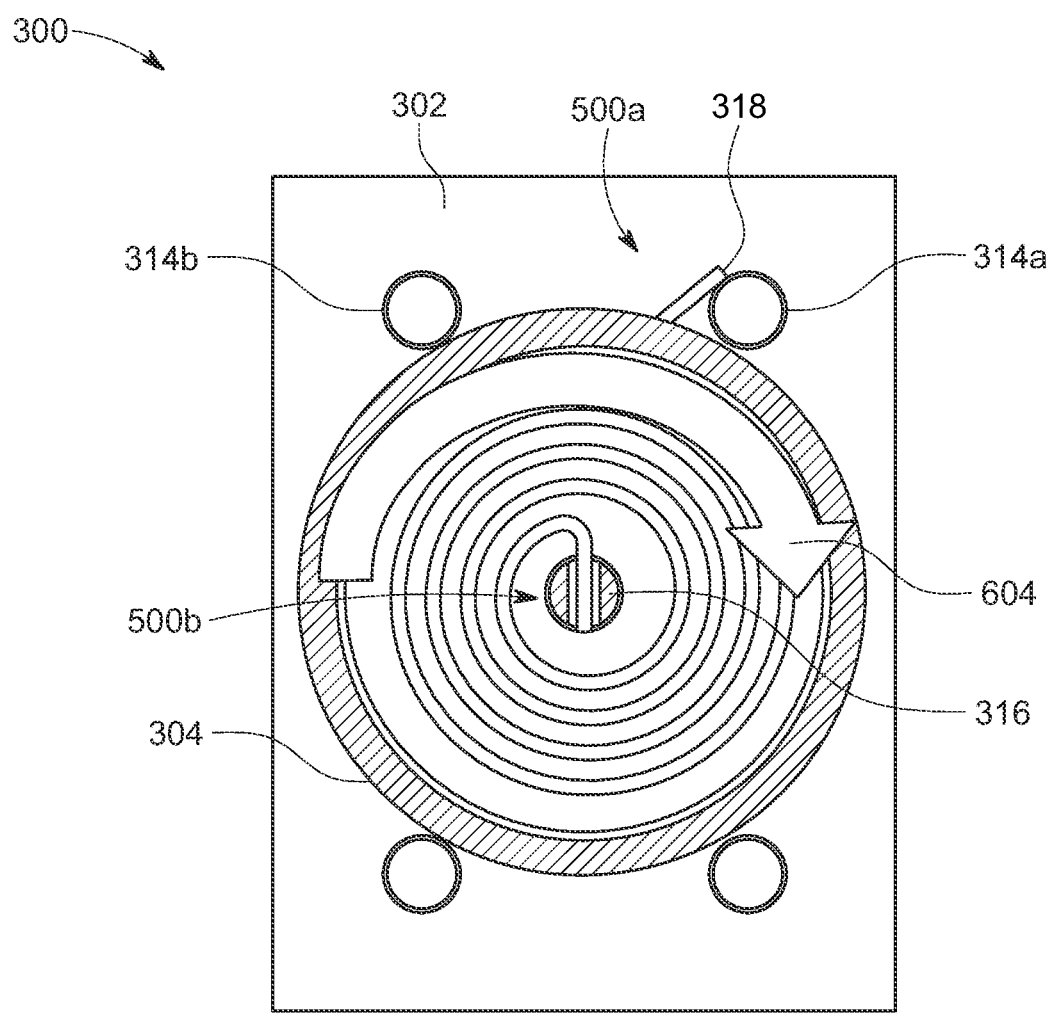
FIG. 6B is a cross-section view of the retractable module in FIG. 6A along the line 6B-6B, according to certain aspects of the present disclosure.

Referring to FIGS. 6A and 6B, once the force acting on the sheet 306 to extend from the tube 304 stops, the tension in the spring 318 causes the sheet 306 to retract in the direction of arrow 602 (FIG. 6A). The tension in the spring 318 also causes the tube 304 with the end 500a of the spring 318 to rotate in the direction of arrow 604 (FIG. 6B). However, with the latch 310 in the fixed position, such as shown in FIGS. 6A and 6B, the end 500a of the spring 318 contacts the first prong (e.g., prong 314a in FIG. 6B), which causes the end 500a of the spring 318 and the tube 304 to stop rotating. Thus, the force acting on the sheet 306 to retract is countered by the force of the prong 314*a*, and the prong 314*a* can maintain the sheet 306 in the withdrawn position.

Figure 7:
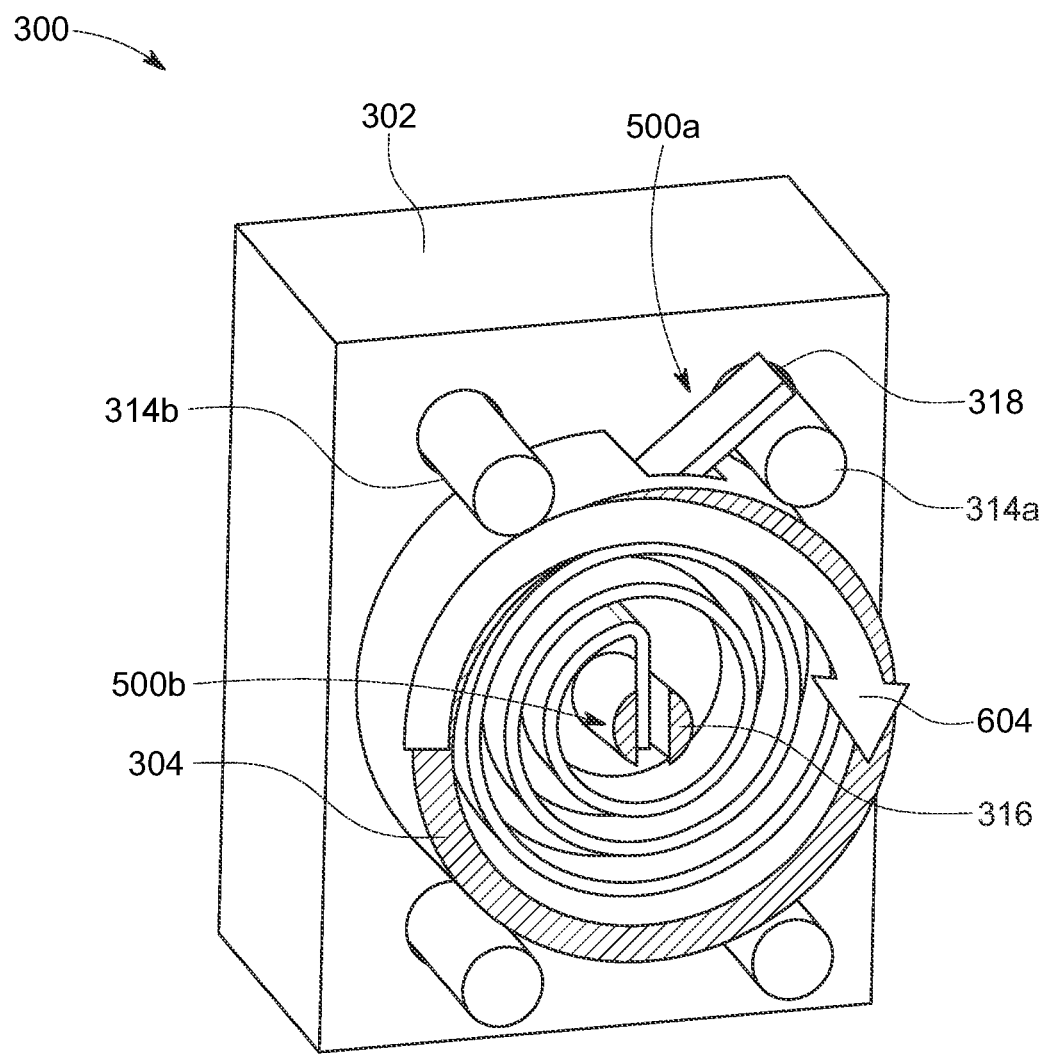
FIG. 7 is a perspective view of a base of the retractable module of FIGS. 6A and 6B, according to certain aspects of the present disclosure.

Referring to FIG. 7, a partial perspective, cross-sectional view of the module 300 is shown with the latch 310 in the fixed position, according to certain aspects of the present disclosure. Namely, the end 500*a* of the spring 318 rests against the prong 314*a*. Despite tension being in the spring 318, the prong 314*a* prevents the tube 304 and the end 500*a* from further rotating in the direction of arrow 604.

According to some embodiments, the end 500*b* of the spring 318 can be fixed to the rod 316 of the latch 310. The rod 316 can be configured to slide relative to the end 500*b* as the latch 310 translates between the fixed position and the released position. Alternatively, and as described above, the end 500*b* of the spring 318 can instead be fixed to the base 302, among other configurations that allow the end 500*b* to not rotate with the tube 304.

Referring back to FIGS. 6A and 6B, translating the latch 310 in the direction of arrow 606 causes the latch 310 to be in the released position by causing the prong 314*a* to retract into the base 302. This allows the tube 304 and the end 500*a* of the spring 318 to rotate in the direction of arrow 604 until the sheet 306 is fully retracted.

The module 300 disclosed above can be included in computing devices according to various different arrangements and configurations, several of which are described below.

Figure 8:
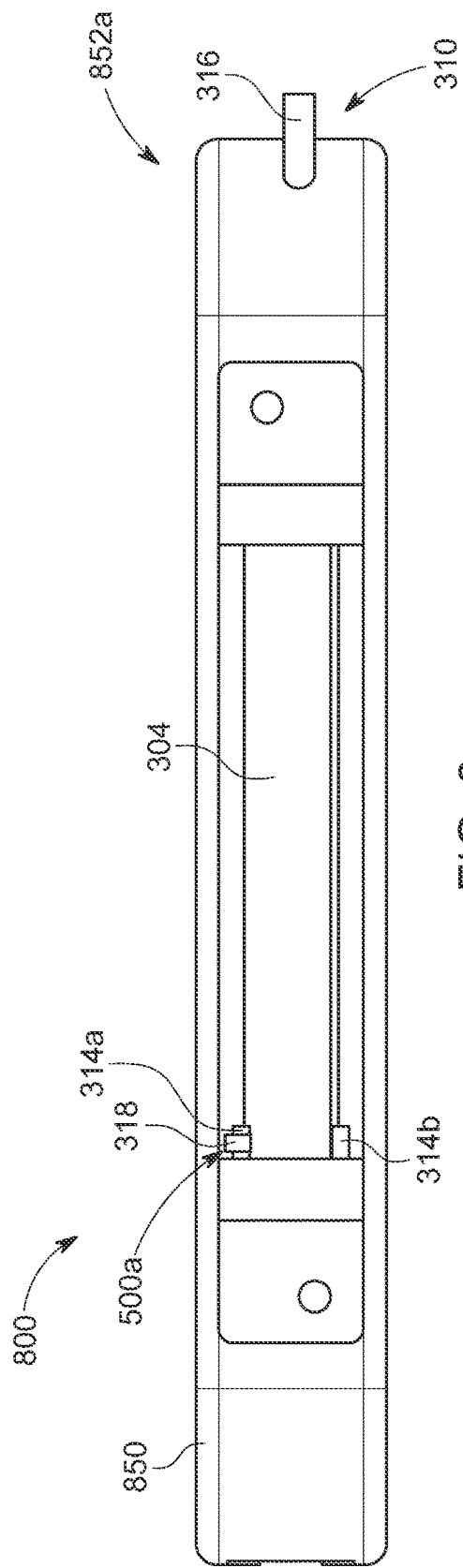
FIG. 8 is a side view of a handle of a computing device with a retractable module, according to certain aspects of the present disclosure.
Figure 9:
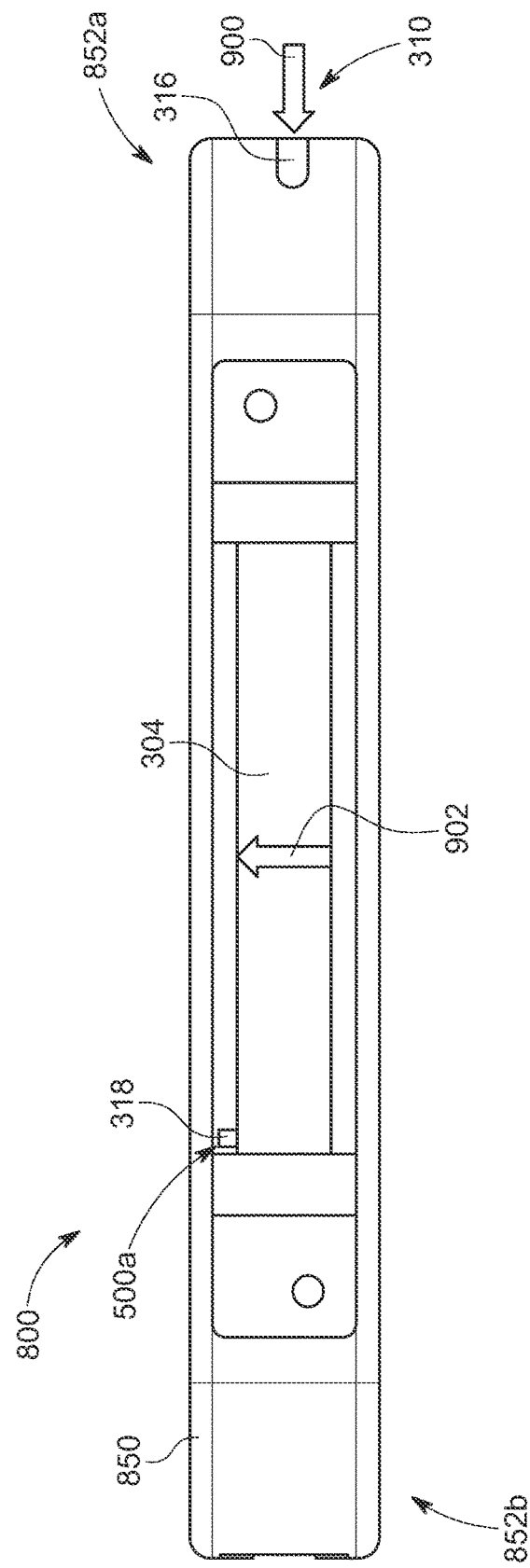
FIG. 9 is a side view of the retractable module of FIG. 8 in a released state, according to certain aspects of the present disclosure.

FIGS. 8 and 9 are side views of a handle 850 with a retractable module 800, according to certain aspects of the present disclosure. The handle 850 can be for a computing device (not shown). Alternatively, the handle 850 can be for various other devices that require information to be provided on a label. The retractable module 800 is similar to the module 300 described above. Therefore, elements of the module 800 that are similar to elements of the module 300 will include the same reference numbers. However, it is understood that the module 800 and the module 300 can be considered different modules according to the present disclosure.

Referring to FIG. 8, the module 800 includes the tube 304, which can retain a label in the form of a sheet (not shown). The module 800 further includes the latch 310 with the prongs 314 and the rod 316, where the rod 316 extends the length of the tube 304 and extends out from one end 852*a* of the handle 850. The module 800 further includes the end 500*a* of the spring 318. The latch 310 is shown in FIG. 8 in the fixed position. Thus, the end 500*a* of the spring 318 is retained against the prong 314*a* to prevent the tube 304 from rotating.

Referring to FIG. 9, when the latch 310 translates into the released position, such as by translating the rod 316 in the direction of arrow 900, the prongs 314 (FIG. 8) retract into the end 852*b* of the handle 850. At which point, the latch 310 is in the released position, which allows the tube 304 to rotate in the direction of arrow 902 based on the tension built up in the spring 318. Of course, the tube 304 can alternatively rotate in the opposite direction of arrow 902 based on, for example, a user withdrawn the corresponding sheet.

Figure 10:
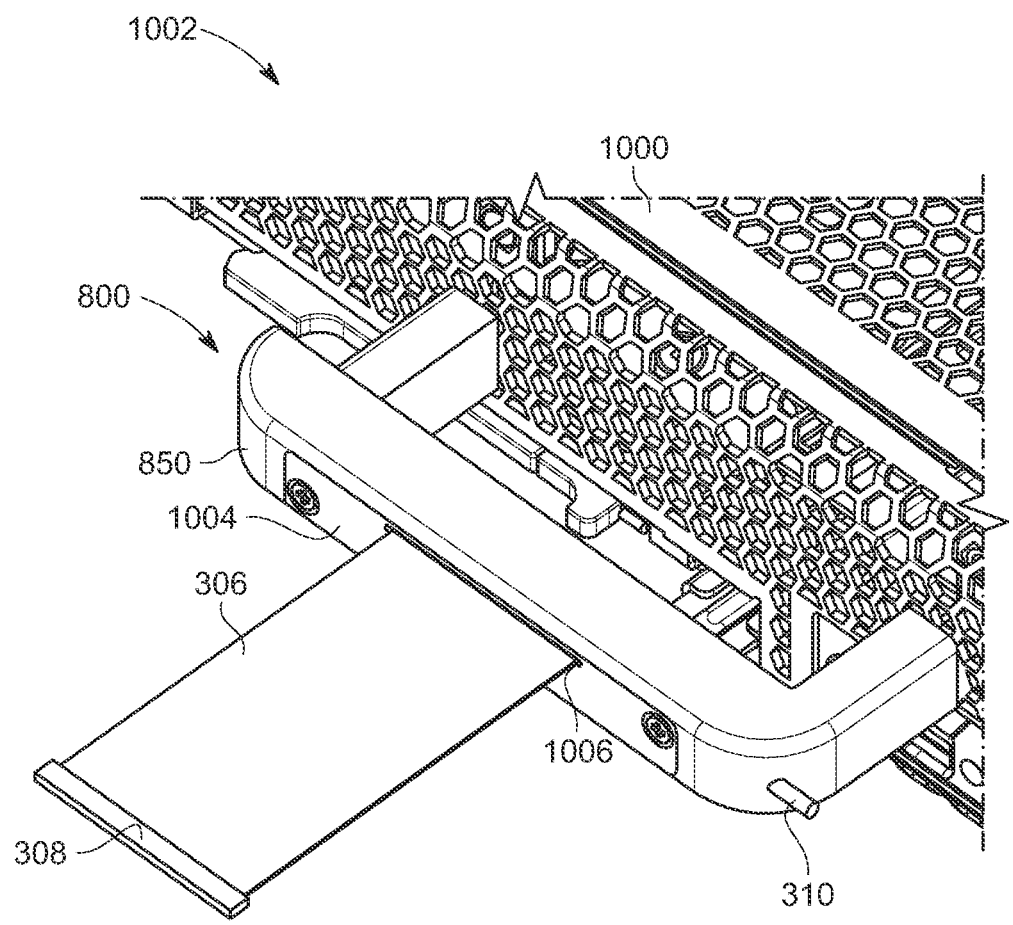
FIG. 10 is partial a perspective view of a retractable module with an extended label, according to certain aspects of the present disclosure.

FIG. 10 is a partial perspective view of the retractable module 800 within the handle 850, according to certain aspects of the present disclosure. More specifically, the module 800 is within the handle 850, which is attached to a chassis 1000 of a computing system 1002. The handle 850 includes a plate 1004 that covers the module 800. The plate 1004 includes a slot 1006 through which the sheet 306 extends. The end stop 308 attached to the sheet 306 prevents the sheet 306 from fully retracting into the handle 850. According to this arrangement, a user can grip the end stop 308 or the sheet 306 to withdraw the sheet 306 and review the information thereon. The user can also depress the latch 310 to control the withdrawal and retraction of the sheet 306. Thus, the user can withdraw the sheet 306 to review the information and then allow the sheet 306 to retract within the module 800. By being located in the handle 850, the module 800 does not block air flow through the chassis 1000 or otherwise take up space on the chassis 1000 that could be used for connecting components to the chassis 1000.

Figure 2:
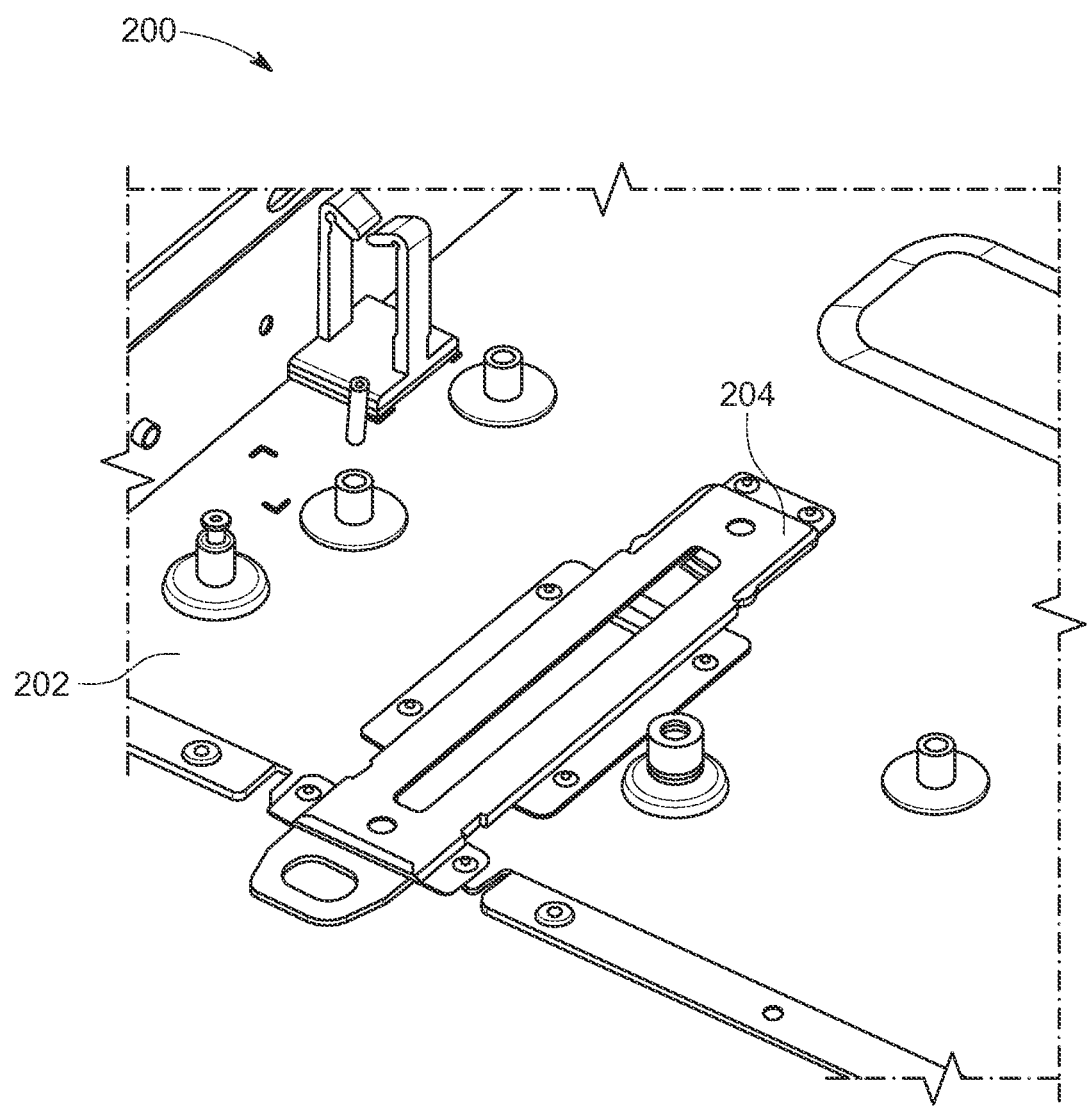
FIG. 2 is a partial perspective view showing another conventional label module.
Figure 11:
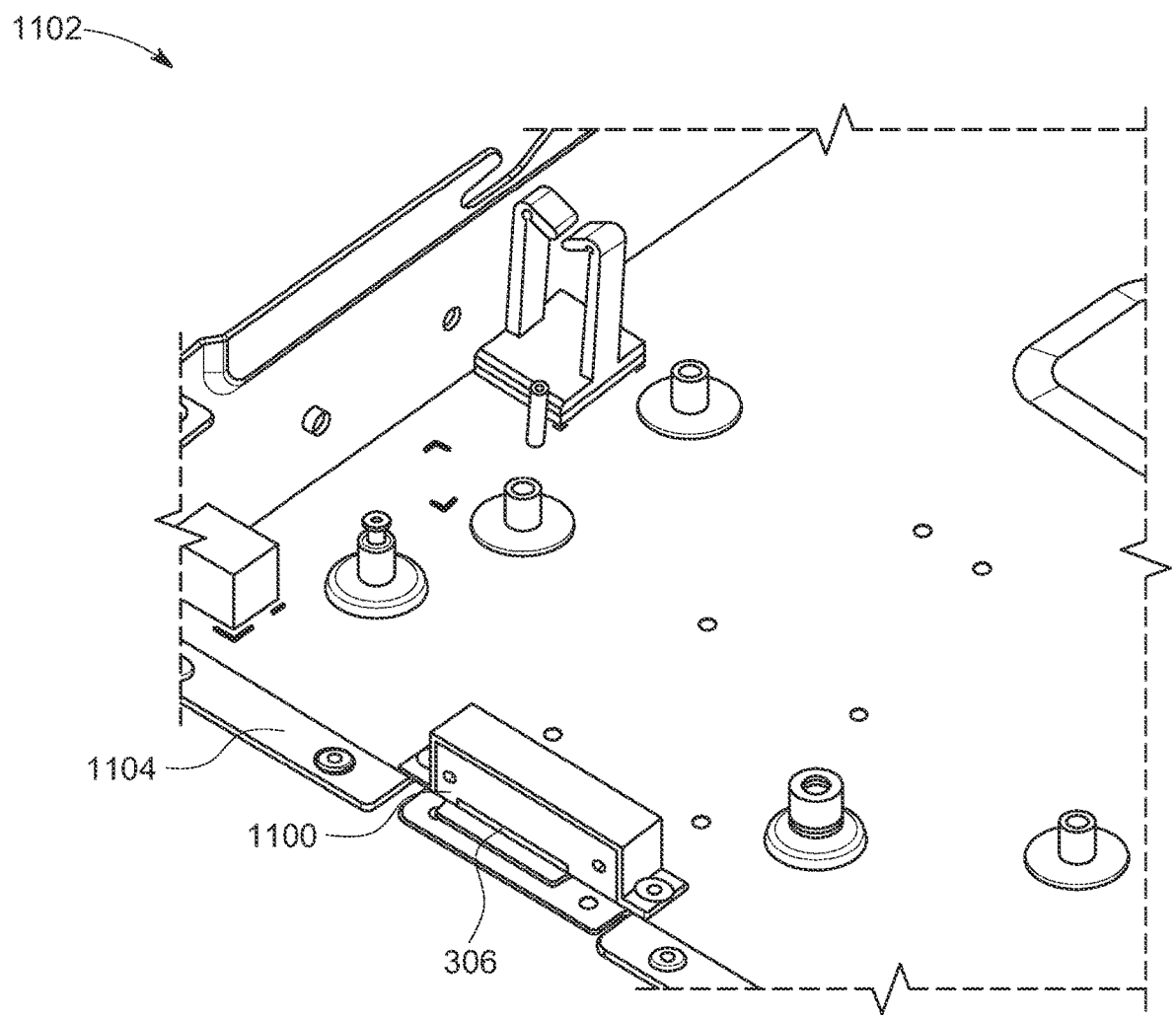
FIG. 11 is a partial perspective view of a retractable module of a computing device, according to certain aspects of the present disclosure.

FIG. 11 is a partial perspective view of a housing 1100 containing a retractable module, such as the module 300, on a computing device 1102, according to certain aspects of the present disclosure. Specifically, the housing 1100 containing the module is attached to the chassis 1104 of the computing device 1102. Unlike the label module 204 of FIG. 2 that takes up considerable space on the chassis 202 based on it being generally flat, the module within the housing 1100 provides the retractable sheet 306 that can be withdrawn for reading information about the computing device 1102 and then retract back into the housing 1100. Thus, the housing 1100 takes up less horizontal space within the chassis 1104.

Figure 12:
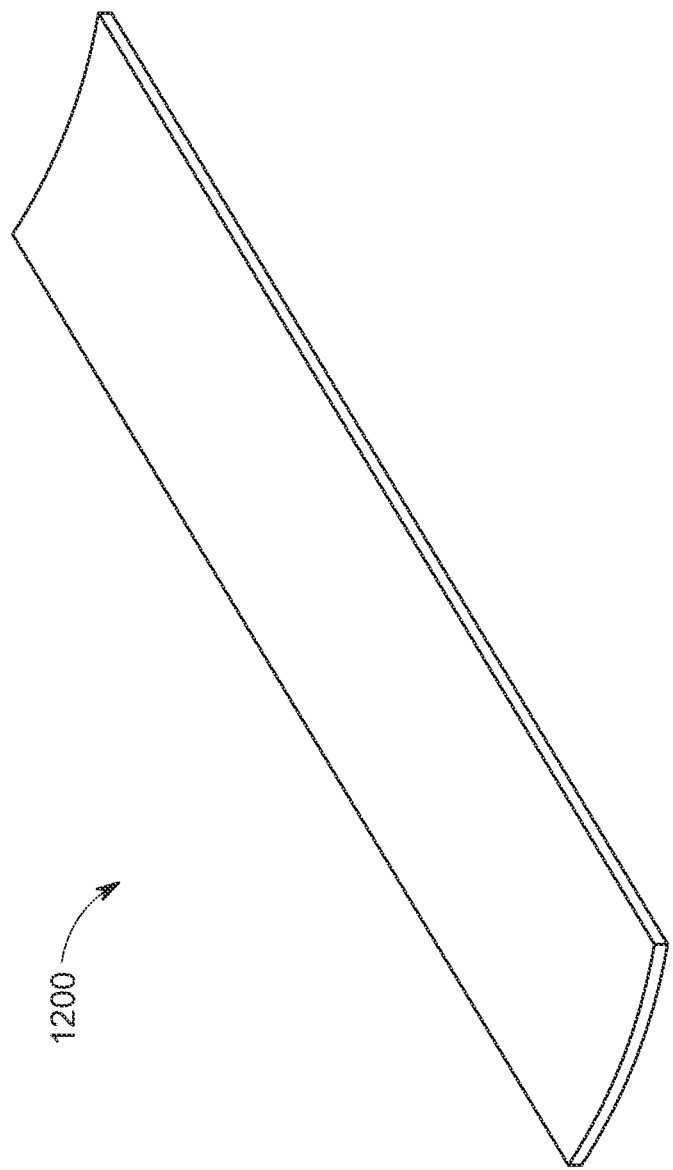
FIG. 12 is a perspective view of a sheet for a retractable module in an extended state, according to certain aspects of the present disclosure.
Figure 13:
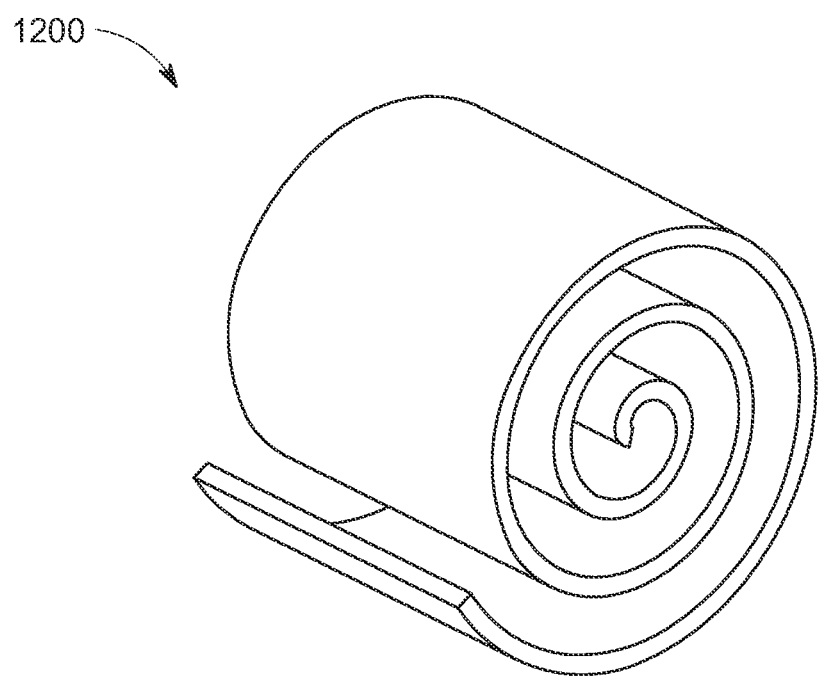
FIG. 13 is a perspective view of the sheet of FIG. 12 in a retracted state, according to certain aspects of the present disclosure.

FIG. 12 is a perspective view of a sheet 1200 for a retractable module, according to certain aspects of the present disclosure. The sheet 1200 can be made of a material and be formed in a specific shape to remain flat in an extended state. For example, the sheet 1200 can be made out of metal or plastic or the like. The sheet 1200 can also be curved across its width. The material and curved shape allows the sheet 1200 to retain its shape and remain in a flat, extended state without a user holding the end opposite of the corresponding module. A force can then be applied to the sheet 1200 to cause the sheet 1200 to lose its flat shape and form back into a spiral shape, as shown in FIG. 13. In the spiral shape, the sheet 1200 can be retracted into its corresponding module around a corresponding tube.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A retractable module comprising:
   a pair of bases spaced apart;
   a tube positioned between the pair of bases, the tube configured to rotate about its center axis relative to the pair of bases;
   a latch including one or more prongs, the latch being configured to move between a release position and a fixed position;

a first spring being configured to urge the tube to rotate in a first direction, the first spring including a first end and a second end, the first end being fixed to not rotate with the tube, the second end being fixed to the tube and configured to:
rest against at least one prong of the one or more prongs when the tube rotates in the first direction with the latch in the fixed position,
rotate with the tube in the first direction when the latch is in the release position, and
rotate with the tube in a second direction that is opposite the first direction when the latch is in the release position; and
a sheet wrapped around the tube, the sheet being configured to:
unwrap from around the tube as the tube rotates in the second direction, and
wrap around the tube as the tube rotates in the first direction.

2. The retractable module of claim 1, wherein the second end of the first spring is further configured to override the one or more prongs as the tube rotates in the second direction with the latch in the fixed position.

3. The retractable module of claim 1, wherein the latch includes a rod that extends between the pair of bases along the center axis of the tube, with a first end of the latch, opposite the one or more prongs, extending from a first base of the pair of bases.

4. The retractable module of claim 1, wherein the one or more prongs extend out from one base of the pair of bases, and an end of the latch extends from the one base.

5. The retractable module of claim 1, wherein the one or more prongs include four prongs evenly spaced around the tube.

6. The retractable module of claim 1, further comprising an end stop attached to a first end of the sheet, the end stop preventing the tube from rotating beyond a stop position.

7. The retractable module of claim 1, further comprising a second spring being configured to urge the latch to the fixed position.

8. The retractable module of claim 1, wherein the sheet is a metal sheet or a plastic sheet.

9. The retractable module of claim 8, wherein the sheet is curved along its width so as to support its own weight when extended from the tube.

10. A computer system comprising:
a chassis; and
a retractable module on the chassis, the retractable module including:
a tube configured to rotate about its center axis;
a sheet wrapped around the tube, the sheet being configured to wrap around the tube as the tube rotates in a first direction and unwrap from around the tube as the tube rotates in a second direction; and
a latch including one or more prongs, the latch being configured to move between a release position and a fixed position.

11. The computer system of claim 10, wherein the retractable module further includes a first spring being configured to urge the tube to rotate in a first direction, the first spring including a first end and a second end, the first end being fixed to the tube, the second end being configured to:
override the one or more prongs as the tube rotates in a second direction, with the latch in the fixed position;
rest against at least one prong of the one or more prongs when the tube rotates in the first direction, opposite the second direction, with the latch in the fixed position;
rotate with the tube in the first direction with the latch in the release position; and
rotate with the tube in a second direction, opposite the first direction, with the latch in the release position.

12. The computer system of claim 11, further comprising a second spring being configured to urge the latch to the fixed position.

13. The computer system of claim 12, further comprising a pair of bases on opposite sides of the tube, wherein the tube is configured to rotate about its center axis between the pair of bases, and the latch includes a rod that extends between the pair of bases along the center axis of the tube, with a first end of the latch, opposite the one or more prongs, extending from a first base of the pair of bases.

14. The computer system of claim 13, wherein the one or more prongs extend out from one base of the pair of bases, and an end of the latch extends from the one base.

15. The computer system of claim 10, wherein the one or more prongs include four prongs.

16. The computer system of claim 15, wherein the four prongs are evenly spaced around the tube.

17. The computer system of claim 10, further comprising an end stop attached to a first end of the sheet, the end stop preventing the tube from rotating beyond a stop position.

18. The computer system of claim 10, wherein the sheet is a metal sheet or a plastic sheet.

19. The computer system of claim 18, wherein the sheet is curved along its width so as to support its own weight when extended from the tube.

20. A computer system comprising:
a chassis; and
a retractable module on the chassis, the retractable module including:
a tube configured to rotate about its center axis;
a sheet wrapped around the tube, the sheet being configured to wrap around the tube as the tube rotates; and
a latch including one or more prongs, the latch being configured to move between a release position and a fixed position.

21. The computer system of claim 20, wherein at least one of the prongs extends out from a base positioned on a side of the tube.

22. The computer system of claim 20, wherein the one or more prongs includes four prongs.

23. The computer system of claim 20, wherein the retractable module further includes a spring configured to urge the tube to rotate in a first direction.

24. The computer system of claim 23, wherein the retractable module further includes another spring that is configured to urge the latch to the fixed position.

* * * * *